United States Patent [19]

Schmitt, III et al.

[11] Patent Number: 5,356,672

[45] Date of Patent: Oct. 18, 1994

[54] METHOD FOR MICROWAVE PLASMA ASSISTED SUPERSONIC GAS JET DEPOSITION OF THIN FILMS

[75] Inventors: Jerome J. Schmitt, III, New Haven; Bret L. Halpern, Bethany, both of Conn.

[73] Assignee: Jet Process Corporation, New Haven, Conn.

[21] Appl. No.: 521,100

[22] Filed: May 9, 1990

[51] Int. Cl.$^5$ .............................................. C23C 16/50
[52] U.S. Cl. ...................................... 427/446; 427/452; 118/723 ME; 118/723 MP
[58] Field of Search ................. 427/34, 38, 39, 45.1, 427/249, 446, 447, 452, 453, 454, 455, 456, 562, 563; 423/446; 118/723, 718, 729, 730, 723 ME, 723 MP

[56] References Cited

U.S. PATENT DOCUMENTS

| | | | |
|---|---|---|---|
| 2,155,932 | 4/1939 | Davis | 427/255 |
| 3,850,679 | 11/1974 | Sopko et al. | 427/162 |
| 4,788,082 | 11/1988 | Schmitt | 427/248.1 |
| 4,851,254 | 7/1989 | Yamamoto et al. | 427/37 |
| 4,871,580 | 10/1989 | Schram et al. | 427/38 |
| 4,909,914 | 3/1990 | Chiba et al. | 204/164 |
| 4,911,805 | 3/1990 | Ando et al. | 204/164 |
| 4,957,061 | 9/1990 | Ando et al. | 118/723 |
| 4,957,062 | 9/1990 | Schuurmans et al. | 118/723 |
| 4,982,067 | 1/1991 | Marantz et al. | 219/121.47 |
| 4,987,002 | 1/1991 | Sakamoto et al. | 427/34 |
| 4,989,541 | 2/1991 | Mikoshiba et al. | 118/723 |
| 5,000,114 | 3/1991 | Yanagi et al. | 118/733 |
| 5,104,634 | 4/1992 | Calcote | 423/446 |

FOREIGN PATENT DOCUMENTS

| | | |
|---|---|---|
| 0286306 | 3/1988 | European Pat. Off. |
| 47-012925 | 4/1972 | Japan |
| 62-158195 | 7/1987 | Japan |
| 63-028874 | 2/1988 | Japan |
| 64-033096 | 2/1988 | Japan |
| 01033096 | 2/1989 | Japan |
| 1-100275 | 4/1989 | Japan |
| 1-179789 | 7/1989 | Japan |
| 01179789 | 7/1989 | Japan |
| 1-292828 | 11/1989 | Japan |
| 2-026895 | 1/1990 | Japan |
| 02026895 | 1/1990 | Japan |
| 899275 | 12/1958 | United Kingdom |

OTHER PUBLICATIONS

Johnson et al, Eds. *Diamond & Diamond-Like Materials Synthesis*, MRS Extended Abstracts-EA-15, Apr. 1988, pp. 95-98.
High Quality MNS Capacitors Prepared by Jet Vapor Deposition at Room Temperature by D. Wang, T. Ma, J. Golz, B. Halpern & J. Schmitt from IEEE Electron Device, vol. 13, No. 9, pp. 482-483, Sep. 1992.
Enhancing Semiconductor Reactions by Nuccio and Schiavone from IBM Technical Disclosure Bulletin, vol. 12 No. 9, Feb. 1970, pp. 1433-1434.
Synthesis of Diamond Films in a RF Induction Thermal Plasma by S. Matsumoto, M. Hino & T. Kobayashi from Appl. Phys Lett., vol. 51, No. 10, 7 Sep. 1987, pp. 737-739.

*Primary Examiner*—Terry J. Owens
*Attorney, Agent, or Firm*—McCormick, Paulding & Huber

[57] ABSTRACT

A thin film is formed on a substrate positioned in a vacuum chamber by use of a gas jet apparatus affixed to a vacuum chamber port and having an outer nozzle with an interior cavity into which carrier gas is fed, an inner nozzle located within the outer nozzle interior cavity into which reactant gas is introduced, a tip of the inner nozzle being recessed from the vacuum chamber port within the outer nozzle interior cavity, and a microwave discharge device configured about the apparatus for generating a discharge in the carrier gas and reactant gas only in a portion of the outer nozzle interior cavity extending from approximately the inner nozzle tip towards the vacuum chamber. A supersonic free jet of carrier gas transports vapor species generated in the microwave discharge to the surface of the substrate to form a thin film on the substrate. The substrate can be translated from the supersonic jet to a second supersonic jet in less time than needed to complete film formation so that the film is chemically composed of chemical reaction products of vapor species in the jets.

7 Claims, 4 Drawing Sheets

METHOD FOR MICROWAVE PLASMA ASSISTED SUPERSONIC GAS JET DEPOSITION OF THIN FILMS

The invention described herein was made with U.S. Government support under Contract No. DE-FG02-88ER13818 awarded by the Department of Energy. The Government has certain rights in this invention.

CROSS REFERENCE TO RELATED PATENTS

Some of the subject matter herein is disclosed and claimed in the commonly owned U.S. Pat. No. 4,788,082 issued Nov. 29, 1988 to J. J. Schmitt and is incorporated herein by reference.

TECHNICAL FIELD

The present invention relates to the deposition of thin film materials, including metals, semiconductors, insulators, organics and inorganics, for application in electronics, photonics and related fields, and more particularly to a method and apparatus for gas jet assisted deposition of thin films.

BACKGROUND OF THE INVENTION

The utility of high quality thin film materials for various applications are well known in the art. As a reference, see "Deposition Technologies for Films and Coatings", by Rointon F. Bunshah, et al, 1982, Noyes Publications, Park Ridge, N.J., or "Thin Films for Free Atoms and Particles", edited by Kenneth J. Klabunde, 1985, Academic Press Inc., N.Y. There are now several processes used to prepare high quality thin film materials.

The Chemical Vapor Deposition (CVD) technique produces a non-volatile solid film on a substrate by the surface pyrolized reaction of gaseous reagents that contain the desired film constituents. A typical CVD process comprises the following steps, (1) gaseous reagent and inert carrier gas are introduced into the reaction chamber, (2) gaseous reagent is transported by convection and diffusion to the surface of the substrate, (3) reagent species are absorbed onto the substrate where they undergo migration and film forming reactions and (4) gaseous byproducts of the reaction and unused reagents are removed from the chamber. The pressure in the deposition chamber may be atmospheric or reduced as low as a fraction of 1 torr, as in the respective cases of Atmospheric Pressure CVD (APCVD) or Low Pressure CVD (LPCVD). The energy required to drive the reactions is supplied as heat to the substrate. For practical reaction rates, substrates are typically heated to temperatures ranging from 500° C. to as high as 1600° C. Consequently, heat sensitive substrates cannot be processed in this manner.

Energy can also be supplied by an RF electric field which powers a gas discharge in the deposition chamber near the substrate surface. This process is referred to as Plasma Enhanced CVD (PECVD). In PECVD, the substrate temperature may be 300° C. or lower. However, the substrate is immersed in the discharge which can also lead to plasma damage of the substrate and the film during growth.

The CVD deposition rate also depends on the local concentration of the gaseous reagent near the substrate surface. Increasing reagent partial pressures can lead to higher film deposition rates. When local reagent concentration is too high, however, undesirable reaction and nucleation of solid particles in the gas phase can occur. These particles can then precipitate onto the substrate surface where they contaminate the growing film. This is especially true for PECVD. It is always desirable to develop methods of film deposition which occur at lower temperatures and which avoid problems associated with plasma damage and gas phas nucleation of particles. In addition, it is desirable to have methods which avoid diffusional mass transport limitations, as film deposition may be limited.

Downstream CVD processing involves reaction of RF or microwave plasma-generated oxygen, or nitrogen radicals with silane or other CVD reagent gas, wherein the CVD reagent gas is introduce into the reaction chamber downstream of the plasma. (See e.g. "Deposition of Device Quality Silicon Dioxide Thin Films by Remote Plasma Enhanced Chemical Vapor Deposition", S. S. Kim, D. V. Tsu and G. Lucovsky, J. of Vac. Sci. & Tech. A 6(3), 1740-4.)

Physical Vapor Deposition (PVD) includes the methods of evaporation (metallizing), sputtering, molecular beam epitaxy, and vapor phase epitaxy. These processes typically occur in a chamber evacuated to below 10-6 torr. The desired film material is present in the chamber as bulk solid material. The material is converted from the condensed phase to the vapor phase using thermal energy (i.e. evaporation) or momentum transfer (i.e. sputtering). The vapor atoms or molecules travel line-of-sight as free molecular rays across the chamber in all directions where they condense on prepared substrates (and on the chamber walls) as a thin film. If the pressure becomes too high, collisions with gas molecules interfere with the vapor transport which therefore reduces the deposition rate. Sputtering can also cause undesirable plasma damage to the thin film and substrate.

Reactive evaporation and sputtering processes involve the intentional introduction into the chamber of oxygen, nitrogen or other reactive gas in order to form oxide, nitride or other compound thin films. Reactive gas pressure must be limited as mentioned above in order to avoid interfering with the transport of the depositing vapor. When the pressure is too high, undesirable nucleation of particles in the gas phase can occur. In conventional reactive processes the solid source material can be contaminated by unwanted reaction with the reactive gas.

It is therefore desirable to develop a method and apparatus of thin film deposition which is operable at higher pressure without diffusion governed transport limitations. It is also desirable to have a method and apparatus of reactive thin film deposition which can occur at a high rate without contamination of a gaseous reagent source. The present invention is directed toward such a method and apparatus.

SUMMARY OF THE INVENTION

An object of the present invention is to deposit high quality thin film materials at a high rate and at a low temperature.

According to the present invention, a system for depositing a film upon a substrate includes a vacuum chamber having a port allowing for access to a vacuum chamber interior, a positioning apparatus for locating a substrate within the vacuum chamber interior; a gas Jet apparatus affixed to the vacuum chamber port for providing controlled entry of gas into the interior of the vacuum chamber. The gas jet apparatus has a large nozzle with an interior cavity and includes a mechanism for providing carrier gas to the large nozzle interior cavity; a small nozzle located within the large nozzle interior cavity for providing a supersonic jet of reagent gas from a small nozzle tip, the tip being configured to provide the reagent gas directly to an outer surface of the substrate; a discharge mechanism configured about the gas jet apparatus for generating a gas discharge in the carrier and reagent gas in a portion of the large nozzle interior cavity substantially displaced from the small nozzle tip towards the vacuum chamber. The system also includes a pump for evacuating gas from the vacuum chamber.

According to the present invention, a system for depositing a film upon a substrate including a vacuum chamber having a plurality of ports allowing for access to a vacuum chamber interior, a translation fixture for receiving a substrate positioned within the vacuum chamber interior and for moving the substrate between a first position and a second position. The system also includes a first gas jet apparatus affixed to a first vacuum chamber port for providing controlled gas entry into the interior of the vacuum chamber. The first gas jet apparatus has a first large nozzle with an interior cavity and includes a first mechanism for providing carrier gas within the first large nozzle interior cavity; a first small nozzle located within the gas jet apparatus interior cavity for providing a supersonic jet of first reagent gas from a first small nozzle tip, the tip configured to 0 provide the first reagent gas directly towards the substrate first position. Also there is a second gas jet apparatus affixed to a second vacuum chamber port for providing controlled gas entry into the interior of the vacuum chamber. The second gas jet apparatus has a second large nozzle with an interior cavity and includes a second mechanism for providing carrier gas within the second large nozzle interior cavity; a second small nozzle located within the second gas Jet apparatus interior cavity for providing a supersonic jet of second reagent gas from a second small nozzle tip, the tip configured to provide the second reagent gas directly towards the substrate second position. The system also includes a pump for evacuating gas from the vacuum chamber. The translation fixture further moves the substrate between the first and second positions within a time less than a time needed to complete film formation on the substrate, thereby ensuring the substrate film is chemically comprised of at least part of the first and second reagents.

DESCRIPTION OF THE PREFERRED EMBODIMENT

Figure 1:
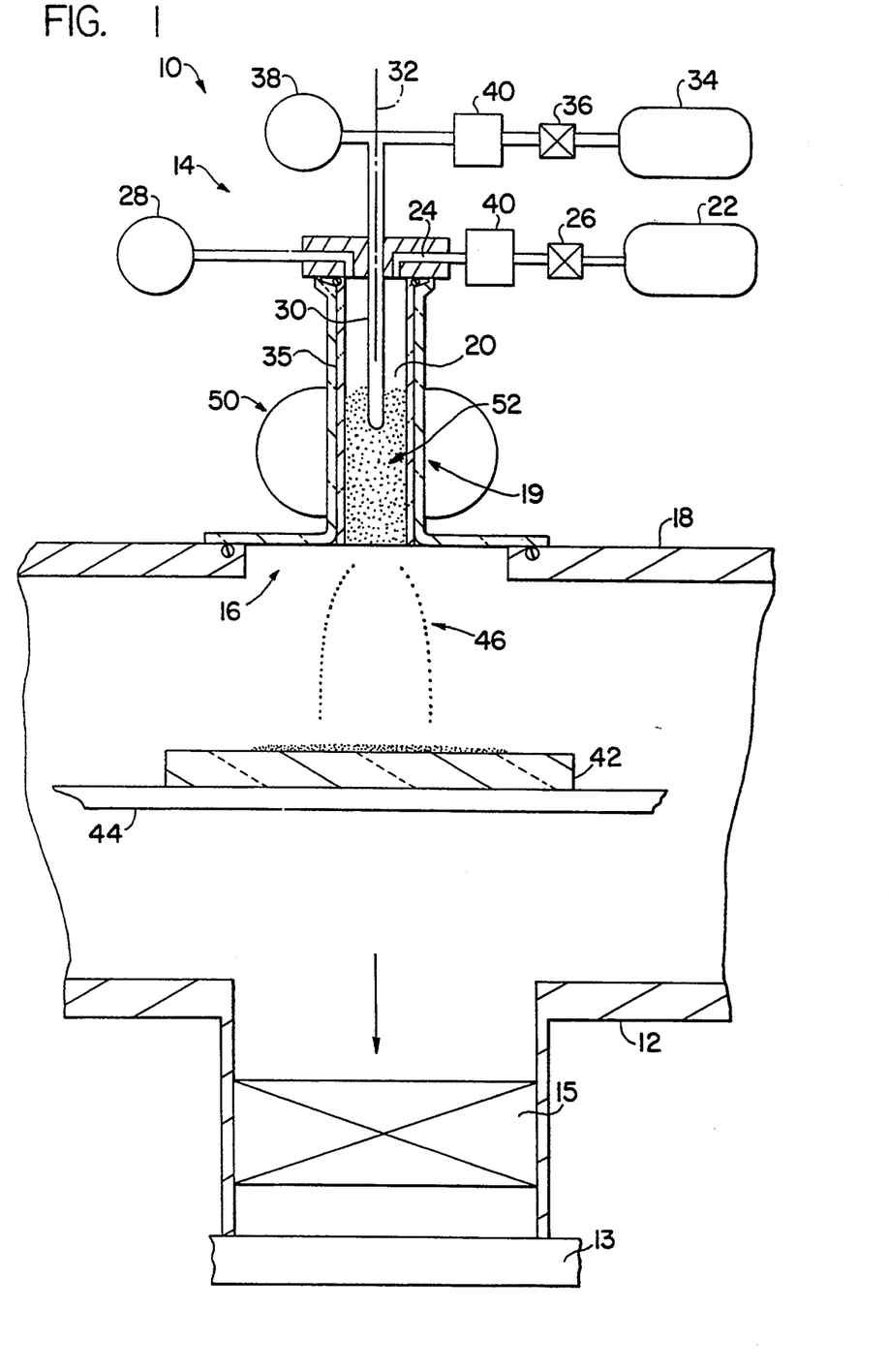
FIG. 1 is a schematic diagram of a deposition system provided according to the present invention.

Referring to FIG. 1, a microwave plasma assisted gas jet deposition system 10 includes a vacuum chamber 12 of a known type is evacuated by a pump 13. In the preferred embodiment the pump is of the roots blower/rotary vane type having a rate volumetric speed of 20,000 liters per minute. Prior to deposition this pump is used to evacuate the chamber to a base pressure of 10 millitorr. This level of vacuum integrity has been adequate to produce high purity films, and avoids the need for costly high vacuum equipment and procedures. As described hereinafter, the carrier gas flow rate can be as high as 20 standard liters per minute. The pumping speed, and therefore the pressure in the vacuum chamber, can be regulated by means of a throttle valve 15 on the pump inlet.

A gas jet apparatus 14 is configured on a port 16 of a wall 18 of the vacuum chamber. The apparatus 14 is comprised of a preferably cylindrical large nozzle 19 with an interior cavity 20. The large nozzle is made from quartz, glass or other suitable dielectric. The exterior of the apparatus 14 is adapted to receive carrier gas from a high pressure reservoir 22 and provide it to the large nozzle by means of tube 24. A valve 26 is fitted to regulate the pressure and flow of carrier gas to the apparatus 14. There is a port associated with the carrier gas supply tube for measuring the gas pressure therein with a manometer 28. The preferred large nozzle is comprised of a PYREX tube, 2.54 cm outer diameter, 2 mm wall thickness and is lined on the inside with a close fitting thin wall quartz tube 35. The quartz liner prevents the heat of a gas discharge from volatilizing any sodium impurity atoms presents in the pyrex, thereby preventing sodium contamination of the thin film deposit.

A small cylindrical nozzle 30, constructed of quartz, glass or stainless steel is fitted into a wall of the gas jet apparatus. The nozzle is preferably coaxial with the gas jet apparatus and is located along an axis 32 extending from the interior of the vacuum chamber. The nozzle receives gas from a reagent high pressure reservoir 34 through a control valve 36. Manometer 38 is used to provide an indication of the reagent gas pressure in the small nozzle. Both the reagent and carrier gas supply lines are fitted with particle filters and oxygen absorbers schematically shown at 40 to insure purity and cleanliness.

A substrate 42 comprised of virtually any material, is placed in the vacuum chamber on a translation mechanism 44 to be substantially registered with so that a gas jet 46 impinges on its surface. The surface of substrates such as glass, quartz, and silicon are precleaned by techniques well known in the art.

Purified carrier gas, such as helium, hydrogen or argon from the high pressure reservoir 22 flows through the nozzle into the vacuum chamber, and then is pumped out by the high speed mechanical vacuum pump. Those skilled in the art will note that nitrogen, oxygen or other reactive gas may be mixed with the carrier gas for the deposition of films such as silicon nitride and silicon dioxide. The flow rates are adjusted so that the pressure within the small nozzle is approximately 600 Torr, the pressure within the large nozzle is 2.5 Torr and that within the chamber is on the order of 1 torr. This is an ideal pressure range for establishing microwave discharge plasmas in the large nozzle interior cavity. By adjusting the flow rates of the several gases, the pressure in the large nozzle interior cavity is maintained at least twice the pressure in the vacuum chamber. The expansion of the reagent gas through the large nozzle reaches sonic speeds, 1 km/sec. for helium at room temperature, and forms a supersonic jet 46 in the vacuum chamber in the vicinity of the substrate 42.

The exit portion of the large nozzle is surrounded by a microwave cavity 50. This microwave cavity may be of the Evenson type and is powered via a coaxial cable from a remote microwave power supply (not shown). The power supply used in the preferred embodiment is manufactured by Kiva Instruments Inc. and is rated to 100 watts. For higher power applications, it may be necessary to use a wave guide and associated applicator. The preferred microwave cavity consists of a 1 inch Evenson Cavity obtained from EMS Ltd., (England) fitted over the large nozzle. The application of microwave power (as little as 40 W) causes a gas discharge (plasma) to form in apparatus region 52 surrounded by the nozzle tip and extending therefrom towards the substrate. Initiating the discharge sometimes requires the application of a spark from a Tesla Coil. Activated and luminescent species are carried by the high speed gas flow downstream from the confines of the nozzle tip and interior cavity where they impinge on the substrate. The substrate is removed from the intense region of the discharge where plasma damage can occur. The present invention departs from conventional downstream processing in this respect because it relies on the introduction of the CVD gas upstream of the plasma in a supersonic flow of inert or reactive carrier gas.

Once the carrier gas flow and plasma are established in steady state condition in the large nozzle interior cavity, a gaseous reagent(s) which contains a desired film constituent(s) is supplied from the reagent gas high pressure reservoir and injected into the plasma via the small nozzle. The preferred small nozzle is tubular and 6.35 mm in diameter, with the orifice of the small nozzle tip being 1 mm diameter. The reagent gas is usually admixed with an inert carrier gas before both are flowed through the small nozzle. It is desirable to avoid initiation of the discharge inside the small nozzle, since a discharge can cause premature dissociation of the reagent species. Consequently, the reagent gas/carrier gas mixture inside the small nozzle is maintained at pressure of 600 torr, sufficiently high to suppress discharge formation. The flow rate through the small nozzle's 1 mm orifice is preferably 3000 sccm. The flow rate of reagent is varied by adjusting the partial pressure of reagent gas in the mixture. For silane reagent, partial pressures can range from 30 millitorr to 3 torr out of the 600 torr total pressure, corresponding to a silane flow rate of between 0.15 to 15 sccm. Other reagents include tungsten hexacarbonyl and acetylene, as well as $TiCl_4$, $BCl_3$, $SiF_4$, $GeH_4$, $WF_6$, $B_2H_6$, $AsH_5$, and volatile organometallic compounds.

After the reagent molecules are injected into the plasma, they are decomposed by collision with high energy electrons and other activated species in a plasma chemical reaction. The products of plasma decomposition are reactive condensible radicals which are rapidly carried by the jet flow through the nozzle and onto the surface of the substrate where they deposit to form a thin film. In the preferred embodiment, the substrate is placed a few centimeters downstream of the exit of the large nozzle. Under typical operating conditions where the jet is supersonic, this corresponds to a time-of-flight for the depositing radicals of a few tens of microseconds. This short time aloft minimizes the possibilities for gas phase nucleation of particles. Nucleation of solids occurs primarily on the substrate surface.

The small nozzle is placed on the center line of the large nozzle sufficiently far downstream to minimize the deposition of solids on the large nozzle walls. By adjusting position and nozzle pressures, it is possible to reduce deposition on the large nozzle to negligible amounts. For a large nozzle having a 2.54 cm diameter opening into the vacuum chamber, the small nozzle is usually positioned 2 cm upstream from the exit of the apparatus into the vacuum chamber.

Deposition on the substrate is most intense at the center of where the jet impinges on the substrate surface. This produces a deposit of non-uniform thickness; thickest in the middle and thinner at the edges. By "scanning" the gas jet across the substrate, or equivalently, by moving the substrate past a stationary gas jet, this non-uniform deposition can be averaged to produce a thin film of uniform thickness. FIG. 1 also includes a translation mechanism 44 used for "scanning" the substrate past a stationary Jet source fitted into the vacuum chamber wall.

Figure 2:
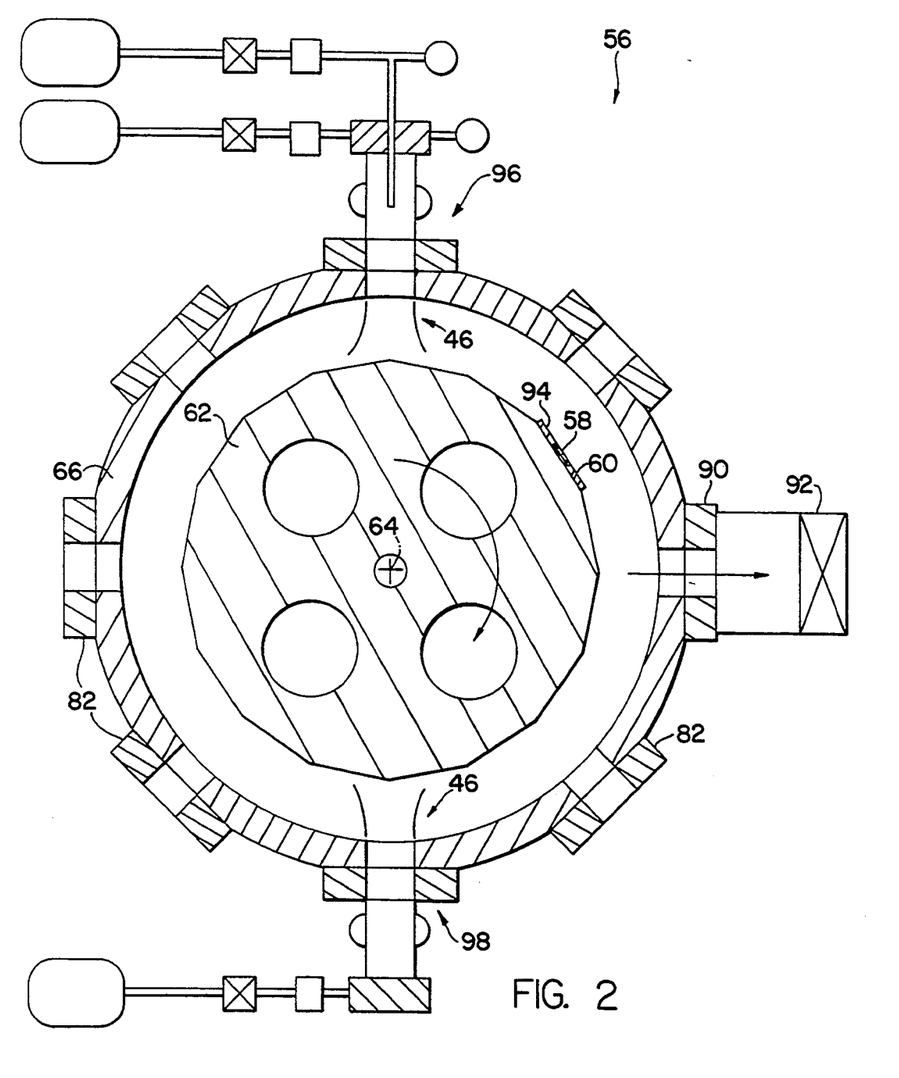
FIG. 2 is a schematic top view of a vacuum chamber found in the system of FIG. 1.
Figure 3:
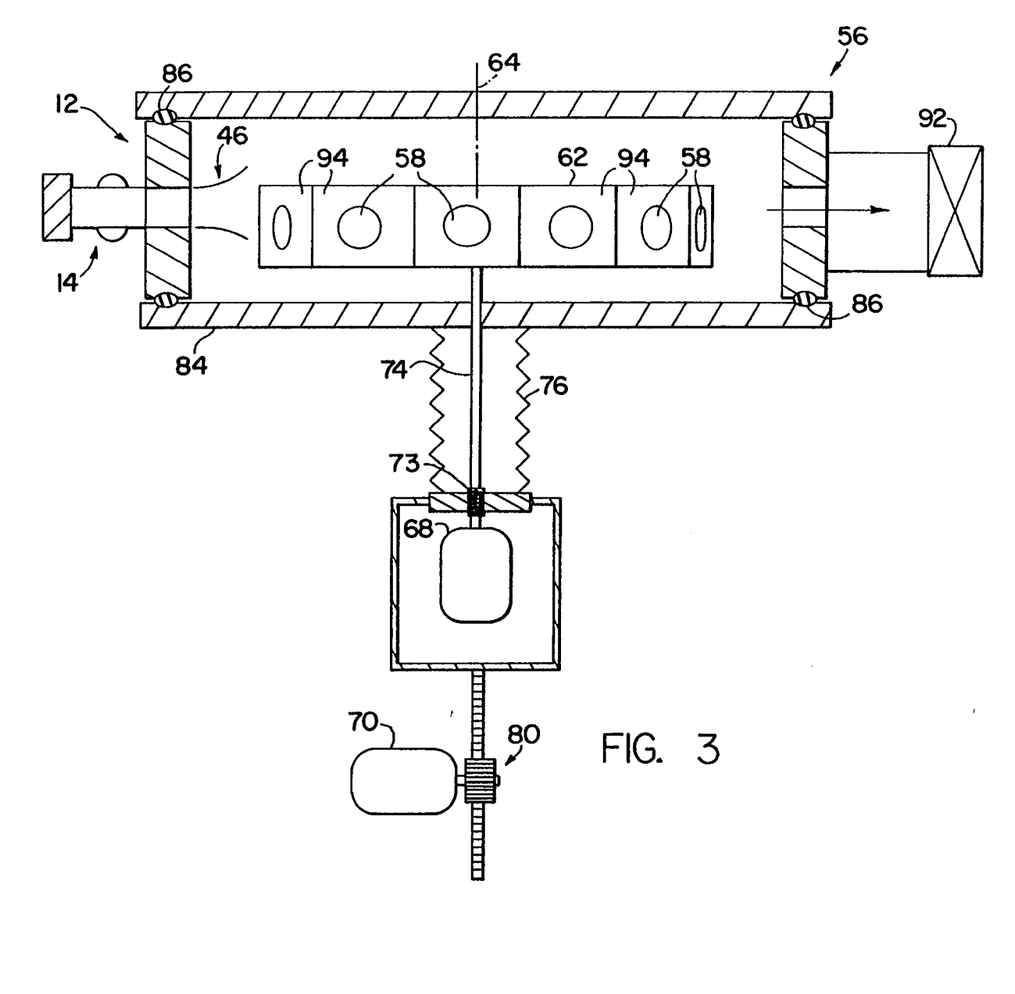
FIG. 3 is a side view of the vacuum chamber depicted in FIG. 2.

FIGS. 2 and 3 illustrate an alternative gas jet deposition system 56 provided according to the present invention. Planar substrates 58 can be glass, quartz, metal, or silicon squares or wafers and are mounted on a flat surface 60 of a cylindrical, polyhedral fixture 62. The fixture is rotatable about an axis 64 that is centrally located inside a circular vacuum chamber 66. The fixture is also translatable along the axis 64, as depicted in FIG. 3. Motive power for rotation and translation is delivered by two external stepper motors 68 and 70 as shown in FIG. 3. Rotating motion is fed into the vacuum by means of an O-ring or ferrofluidic seal feed through 73 of the type well known to those skilled in the art, and delivered to the fixture via a drive shaft 74. Translation can be fed into the vacuum chamber by means of a bellows 76 or O-ring seal (not depicted) which is actuated by a motor 70 and rack and pinion mechanism 80.

The system 56 comprises a 48.3 cm diameter cylindrical aluminum chamber 66 with 2.54 cm thick walls, having eight ports 82 spaced equidistant around its circumference. The chamber rests on a 2.54 cm thick aluminum baseplate 84. The chamber is sealed with O-rings 86. Either a top-plate 88 or a bell jar (not depicted) is used for sealing the chamber. One of the eight ports is used as a pumping port 90 which can be closed by a butterfly valve 92. The preferred rotating fixture is 35 cm across and 1 cm thick, with 18 flat sides each 6 cm in length. Square plates 94 6 cm×6 cm×3 mm are attached to each of the eighteen sides. The substrates 58 (e.g.; 2" Si wafers, 2" square glass slides) are held in pockets precisely machined into the plates so that the substrate surface is exposed to the gas jet. Springs apply pressure on the backside of the substrates to hold them in place. The total area exposed to deposition flux on this fixture is therefore 18×6 cm×6 cm=650 square centimeters.

Gas jet apparatus 96, 98 are fitted into two of the ports and directed radially inward toward the surface of the fixture where the prepared substrates are held. These apparatus' are used to establish a constant flux of depositing vapor directed toward the surface of the substrates held on the rotating/translating fixture. Rapid rotation at constant speed and slow scanning at a constant rate along axis 64 exposes the entire surface of the substrates to the depositing flux of vapor for an equal amount of time. This relative motion "averages" the non-uniform depositing flux to produce an overall even deposit. Consequently, films of a very uniform thickness can be fabricated.

Typical motion/process parameters in a deposition of silicon for the system 56 rotation rate: 2 revs./sec., scan rate: 12 cm/min., scan length: 6.5 cm, number of scan "passes" back-and-forth: 40, total run time: 15 min., deposit thickness: 150 nm., deposit area: 650 cm2. Note that at the rotation rate noted above, the fixture will have completed 1800 rotations during the run. Consequently, the process, on average, deposits less than 0.1 nm of film thickness (one monolayer) per rotation. By careful control of deposition rate, and run time, it is possible to control film thickness at near monolayer resolution. Deposition rate can easily be reduced from the above cited figure; also higher rates of rotation can be employed (i.e. up to 100 Hz).

A small flow of a gaseous reagent (e.g. silane) is injected into the quartz nozzle and the carrier gas flow via a concentric inner tube(s) placed Just upstream of the discharge region. The microwave discharge efficiently dissociates the gaseous reagent in a plasma-chemical reaction. The condensible products of decomposition are entrained and convected rapidly downstream by the carrier gas flow. The jet of carrier gas containing the condensible vapor impinges on the surface of the substrate. This serves to transport the highly reactive radicals generated in the plasma to the surface of the substrate, where the vapor deposits to form a thin solid film. The sonic jet overcomes diffusional transport limitations and deposition can be quite rapid. The deposition rate is regulated by controlling the flow of gaseous reagent. The substrate can remain at room temperature during processing, or it can be heated or cooled to influence film properties. Substrate temperature can be adjusted without significant effect on deposition rate.

Deposition from a circular nozzle results in a localized (usually circular) deposit on the substrate surface. Nozzles of differing shape produce other deposition patterns. By means of a moveable substrate fixture, the zone of deposition can be "scanned" at high rate across the surface of a substrate in order to produce an average deposition versus time profile across a substrate surface area larger than the deposition zone. With careful control of the scan rate versus deposition rate it is possible to "average out" the non-uniform deposition profile and thereby deposit a thin film of uniform thickness over a large substrate area. The high local rate of deposition permit practical processing of large areas of substrate. Furthermore, by precise control over parameters of deposition rate and scan rate, it is possible to control the thickness of the deposit at the level of monolayers of surface film coverage over large areas.

Figure 4:
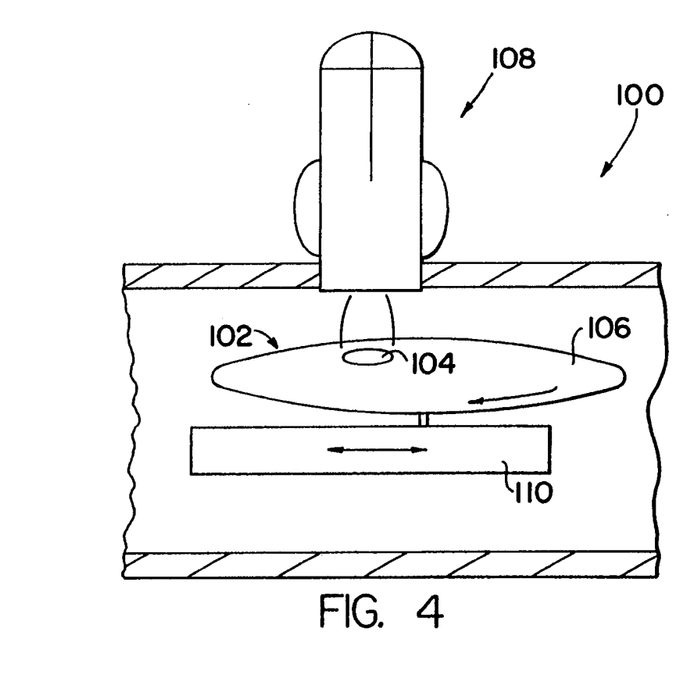
FIG. 4 is a schematic illustration of a portion of an alternative fixture to that shown in FIG. 2.

An alternative fixture 100 is seen in FIG. 4. The alternative fixture 100 employs a disc 102 rotating at a constant rate. Substrate 104 is mounted on a flat, upper surface 106 of the disc. This surface is exposed to a gas jet from a gas jet deposition apparatus 108 aimed at the surface 106 of the spinning disc. The disc surface is then "scanned" by a mechanism 110 past the gas Jet in a manner not unlike the way a phonograph stylus scans across the surface of phonograph record during play. The scanning is controlled in a stepwise fashion that accounts for 0 the change in the radius of rotation, so that each portion of the disc surface (i.e. unit area) is exposed to the constant deposition flux for an equal amount of time. In a manner similar to that described above for the cylindrical fixture, this results in a thin film deposit of uniform thickness across the disc.

Figure 5:
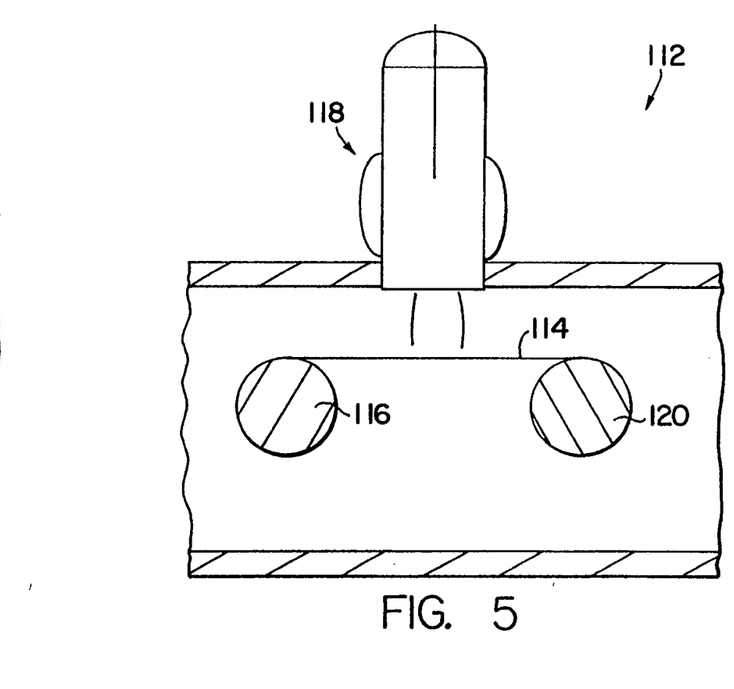
FIG. 5 is a schematic illustration of a portion of an alternative system to that shown in FIG. 1.

As shown in FIG. 5, the present invention also can be adapted for use with fiber; wire or web substrates. For example in deposition system 112 substrate 114 may be passed from a roll or spool 116 past at least one gas jet apparatus 118, where it receives a thin coating of uniform thickness, and then onto a take-up spool 120.

Although the process occurs at relatively high gas pressure, the flow of highly purified carrier gas continuously purges the chamber of background vapors and particles which otherwise could contaminate the growing film. Furthermore, pump oils cannot stream back from the mechanical pump to contaminate the deposition chamber. The gas jet shields the deposition zone from contamination and high purity films are produced. The energy for the film forming reactions is supplied upstream in the gas plasma. Consequently, the reaction at the substrate can occur at low temperature. In all cases, the substrate need not pass through the gas discharge itself.

In a variation of the process, oxygen, nitrogen or other reactive gas is admixed into the flow of helium or argon carrier gas in the nozzle or with the carrier gas. Reactive gas molecules pass thus through the plasma where many of them are dissociated into atoms and excited to activated states. The atoms and activated species react with the depositing vapor species and the growing film to form oxide and nitride materials.

A second variation of the process shown in FIGS. 2 and 3 utilizes a plurality of gas jet deposition apparatus mounted about the vacuum chamber. Activated oxygen or nitrogen atoms and molecules are produced by flowing either oxygen, nitrogen, ammonia, nitrous oxide or other reagent through a microwave discharge and into a respective port on the vacuum chamber with the substrates rotating within the vacuum chamber from one port to the next. As noted above, the process parameters can be adjusted so that films of monolayer thickness can be deposited per rotation of the substrate fixture. Consequently, as each monolayer of film is deposited, it is treated with activated reactive molecules and atoms supplied by the second, third, etc apparatus in order to convert the film immediately upon deposition into an oxide or nitride material.

As noted above, a substrate surface can alternately be exposed to 1) a gas jet deposition source(s) of depositing vapor and 2) an auxiliary jet(s) of either oxygen, nitrogen, ammonia or nitrous oxide gas which contain highly reactive activated species and dissociated atoms excited by means of an additional microwave discharge. Rapid alternation of the substrate surface between exposure to the metal vapor deposition source and then exposure to the source of reactive species, results in deposition of a metal film of monolayer thickness (ca. 1 angstrom) which is immediately thereafter oxidized or nitrodized. By repeating these two steps at high frequency, it is possible to build up the oxide or nitride film thickness rapidly. In this manner, surface reaction of metal films monolayer-by-monolayer during deposition can produce fully oxidized or nitrodized films without the need for reactive species to diffuse through a solid layer.

A system provided according to the present invention yields high quality thin films of silicon oxide and silicon nitride by injecting silane into the nozzle containing a discharge of helium and oxygen or nitrogen. These films, produced at near room temperature, possess electronic properties similar to films produced by conventional processes at 500° C.

Similarly, although the invention has been shown and described with respect to a preferred embodiment thereof, it should be understood by those skilled in the art that various other changes, omissions and additions thereto may be made therein without departing from the spirit and scope of the present invention.

We claim:

1. A method for depositing a film upon a substrate, said method comprising the steps of:
   providing a vacuum chamber having a port allowing for access to a vacuum chamber interior,
   positioning the substrate within said vacuum chamber interior;
   depositing the film on said substrate by providing controlled entry of a reactant gas substantially at room temperature into the interior of the vacuum chamber by means of a gas jet apparatus affixed to said vacuum chamber port, said gas jet apparatus comprising
   an outer nozzle having an interior cavity;
   means for providing carrier gas, substantially at room temperature to said outer nozzle interior cavity;
   an inner nozzle located within said outer nozzle interior cavity for providing a supersonic jet of reactant gas from an inner nozzle tip configured to provide said reactant gas directly to an outer surface of said substrate, said inner nozzle tip being recessed from said vacuum chamber port within said outer nozzle interior cavity;
   a discharge means configured about said gas jet apparatus for generating a discharge in said carrier and reactant gas only in a portion of said outer nozzle interior cavity extending from approximately said inner nozzle tip towards said vacuum chamber; and
   evacuating gas from said vacuum chamber for maintaining a pressure in said vacuum chamber.

2. A method for depositing a film upon a substrate, said method comprising the steps of:
   providing a vacuum chamber having a plurality of ports allowing for access to a vacuum chamber interior,
   positioning the substrate on a translation fixture within said vacuum chamber interior;
   moving said substrate between a first position and a second position;
   depositing a first portion of the film on said substrate by providing controlled entry of a first reactant gas substantially at room temperature into the interior of the vacuum chamber by means of a first gas jet apparatus affixed to a first vacuum chamber port, said first gas jet apparatus including:
   a first outer nozzle having an interior cavity;
   a first means for providing carrier gas substantially at room temperature within said first outer nozzle interior cavity;
   a first inner nozzle located within said first outer nozzle interior cavity for providing a supersonic jet of first reactant gas from a first inner nozzle tip configured to provide said first reactant gas directly towards said substrate first position, said first inner nozzle tip being recessed from said vacuum chamber port within said first outer nozzle interior cavity;
   depositing a second portion of the film on said substrate by providing controlled entry of a second reactant gas into the interior of the vacuum chamber by means of a second gas jet apparatus affixed to a second vacuum chamber port, said second gas jet apparatus including:
   a second outer nozzle having an interior cavity;
   a second means for providing carrier gas substantially at room temperature within said second outer nozzle interior cavity;
   a second inner nozzle located within said second outer nozzle interior cavity for providing a supersonic jet of second reactant gas substantially at room temperature from a second inner nozzle tip configured to provide said second reactant gas directly towards said substrate second position, said second inner nozzle tip being recessed from said vacuum chamber port within said second outer nozzle interior cavity;
   evacuating gas from said vacuum chamber to maintain a pressure in said vacuum chamber: and
   translating said substrate between said first and second positions within a time less than a time needed to complete film formation on said substrate to ensure the film is chemically comprised of chemical reaction products of said first and second reactant gasses.

3. The method of claim 2 further comprising the step of providing a discharge means configured about said first gas jet apparatus for generating a discharge in said first carrier gas and first reactant gas only in a portion of said first outer nozzle interior cavity extending from approximately said first inner nozzle tip toward said vacuum chamber, said first inner nozzle tip being recessed from said first vacuum chamber port within said first outer nozzle interior cavity.

4. The method according to claim 2 further comprising the step of providing said first carrier gas within said first outer nozzle at an approximate pressure of 2.5 Torr.

5. The method of claim 2 further comprising the step of providing said first reactant gas within said first inner nozzle at a pressure of approximately 600 Torr.

6. A method for depositing a film upon a substrate, said method comprising the steps of:
   providing a vacuum chamber having a port allowing for access to a vacuum chamber interior,
   positioning a substrate within said vacuum chamber interior;
   providing controlled entry of a reactant gas substantially at room temperature into the interior of the vacuum chamber by means of a gas jet apparatus affixed to said vacuum chamber port, said gas jet apparatus comprising
   an outer nozzle having an interior cavity;
   a means for providing carrier gas at an approximate pressure of 2.5 Torr and substantially at room temperature to said outer nozzle interior cavity;
   an inner nozzle located within said outer nozzle interior cavity for providing a supersonic jet of reactant gas from an inner nozzle tip configured to provide said reactant gas directly to an outer surface of said substrate, said inner nozzle tip being recessed from said vacuum chamber port within said outer nozzle interior cavity;
   a discharge means configured about said gas jet apparatus for generating a discharge in said carrier and reactant gas only in a portion of said outer nozzle interior cavity extending from approximately said inner nozzle tip towards said vacuum chamber; and
   evacuating gas from said vacuum chamber for maintaining a pressure in said vacuum chamber.

7. A method for depositing a film upon a substrate, said method comprising the steps of:

providing a vacuum chamber having a port allowing for access to a vacuum chamber interior, positioning a substrate within said vacuum chamber interior;

providing controlled entry of a reactant gas substantially at room temperature into the interior of the vacuum chamber by means of a gas jet apparatus affixed to said vacuum chamber port, said gas jet apparatus comprising an outer nozzle having an interior cavity;

a means for providing carrier gas substantially at room temperature to said outer nozzle interior cavity;

an inner nozzle located within said outer nozzle interior cavity for providing a supersonic jet of reactant gas at an approximate pressure of 600 Torr from an inner nozzle tip configured to provide said reactant gas directly to an outer surface of said substrate, said inner nozzle tip being recessed from said vacuum chamber port within said outer nozzle interior cavity;

a discharge means configured about said gas jet apparatus for generating a discharge in said carrier and reactant gas only in a portion of said outer nozzle interior cavity extending from approximately said inner nozzle tip towards said vacuum chamber; and evacuating gas from said vacuum chamber for maintaining a pressure in said vacuum chamber.

* * * * *